US006987812B1

(12) United States Patent
Schenk

(10) Patent No.: US 6,987,812 B1
(45) Date of Patent: Jan. 17, 2006

(54) DIGITAL RECEIVER FOR A SIGNAL GENERATED WITH DISCRETE MULTI-TONE MODULATION

(75) Inventor: Heinrich Schenk, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/806,140

(22) PCT Filed: Sep. 1, 1999

(86) PCT No.: PCT/DE99/02752

§ 371 (c)(1),
(2), (4) Date: Jun. 27, 2001

(87) PCT Pub. No.: WO00/19675

PCT Pub. Date: Apr. 6, 2000

(30) Foreign Application Priority Data

Sep. 28, 1998 (DE) ................. 198 44 460

(51) Int. Cl.
H04K 1/10 (2006.01)

(52) U.S. Cl. .................. 375/260; 375/350
(58) Field of Classification Search ........ 375/229, 375/230, 231, 232, 240, 260, 350; 708/323

See application file for complete search history.

(56) References Cited

U.S. PATENT DOCUMENTS

| 5,285,474 | A | | 2/1994 | Chow et al. ............... 375/13 |
|---|---|---|---|---|
| 5,694,422 | A | | 12/1997 | Kaku et al. ............... 375/229 |
| 5,796,814 | A | | 8/1998 | Brajal et al. ............... 375/232 |
| 5,857,000 | A | * | 1/1999 | Jar-Ferr et al. ............ 375/240 |
| 6,266,367 | B1 | * | 7/2001 | Strait ....................... 375/229 |
| 6,401,107 | B1 | * | 6/2002 | Yang et al. ............... 708/551 |
| 6,553,066 | B1 | * | 4/2003 | Pollet et al. ............... 375/232 |
| 6,674,795 | B1 | * | 1/2004 | Liu et al. .................. 375/231 |

FOREIGN PATENT DOCUMENTS

EP 0725509 A1 8/1996

OTHER PUBLICATIONS

*Equalizer Training Algorithms for Multicarrier Modulation Systems*, Jacky S. Chow, John M. Cioffi and John A.C. Bingham, Proceedings of ICC 1993, pp. 761-765.
*Impulse Response Shortening for Discrete Multitone Transceivers*, Peter J.W. Melsa, Richard C. Younce and Charles E. Rohrs, IEEE Transactions on Communications, vol. 44, No. 12, Dec. 1996, pp. 1662-1672.
*Time-domain equalization for multicarrier communication*, Mark van Bladel, et al., IEEE Global Telecommunications Conference, NY, pp. 761-765.

* cited by examiner

*Primary Examiner*—Don N. Vo
(74) *Attorney, Agent, or Firm*—Fish & Richardson P.C.

(57) ABSTRACT

A digital receiver for receiving DMT signals includes a time-domain equalizer that includes a digital filter having fixed coefficients.

6 Claims, 3 Drawing Sheets

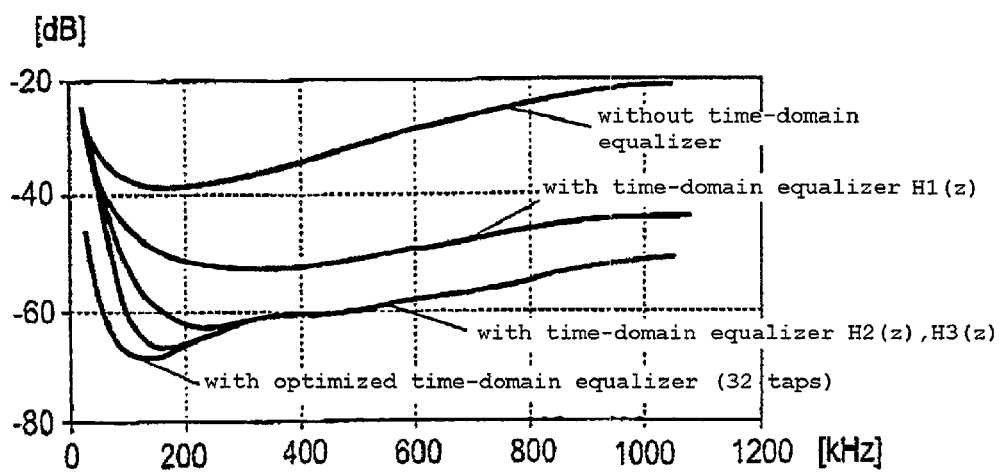
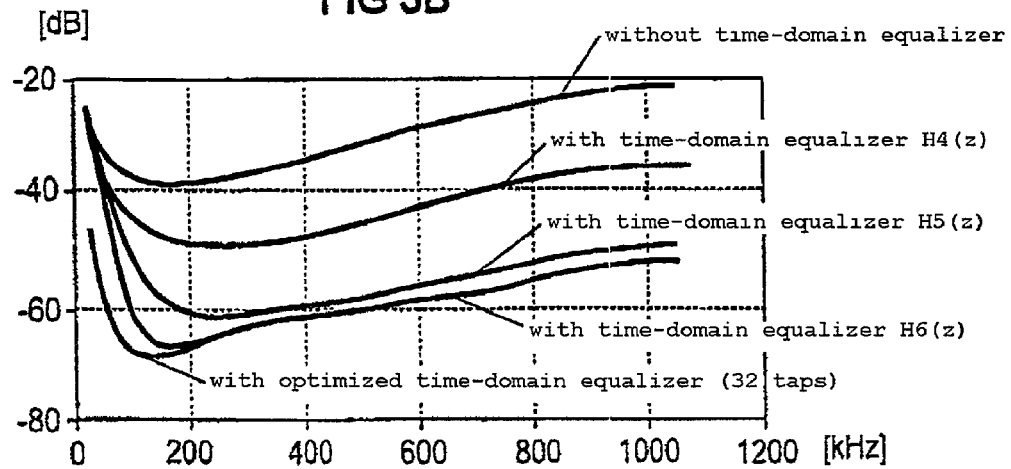

DIGITAL RECEIVER FOR A SIGNAL GENERATED WITH DISCRETE MULTI-TONE MODULATION

FIELD OF INVENTION

The invention relates to a digital receiver for a signal produced using discrete multitone modulation.

BACKGROUND

Discrete multitone modulation (DMT), also referred to as multicarrier modulation, is a modulation method which is particularly suitable for transmitting data via channels in which linear distortion occurs. In comparison to so-called single-carrier methods such as amplitude modulation, which has only one carrier frequency, discrete multitone modulation makes use of a is large number of carrier frequencies. The amplitude and phase of each individual carrier frequency is modulated using quadrature amplitude modulation (QAM). This thus results in a large number of QAM-modulated signals. A specific number of bits may in each case be transmitted per carrier frequency. Discrete multitone modulation is used for digital audio broadcast DAB where it is referred to as OFDM (Orthogonal Frequency Division Multiplex) and for transmitting data via telephone lines, where it is referred to as ADSL (Asymmetric Digital Subscriber Line).

In ADSL, a DMT-modulated signal is used to transmit data from a switching center via a subscriber line to a subscriber with an analog connection. In this case, ETSI and ANSI Standards state that each carrier frequency has a bandwidth of approximately 4 kHz, and that at most up to 15 bits per second per Hz are transported. The actual number of bits per second per Hz may differ for each carrier frequency, thus allowing the data rate and transmission spectrum to be matched to the transmission channel.

A DMT transmission system has a coder which combines the bits in a serial digital data signal which is intended to be transmitted, to form blocks. A specific number of bits in a block in each case have an associated complex number. A complex number is used to represent a carrier frequency $f_i = i/T$ where $i = 1, 2, \ldots, N/2$ in the discrete multitone modulation, with all the carrier frequencies $f_i$ being distributed at equal intervals. T is the time duration of a block. Inverse Fourier transformation is used to transform the carrier frequencies represented by the complex numbers to the time domain, where they directly represent N samples of a DMT signal to be transmitted. In order to allow Inverse Fast Fourier Transformation (IFFT) to be used, a power of two is selected for N. This reduces the complexity for Inverse Fast Fourier Transformation.

After the Inverse Fast Fourier Transformation, a cyclic prefix is carried out, with the last M (M<N) of the samples being attached once again to the start of a block. A periodic signal is thus simulated for a receiver, once the transient process produced by a transmission channel has decayed after M samples corresponding to a time T·M/N. The equalization complexity in the receiver can be greatly reduced by means of the cyclic prefix since, after demodulation in the receiver, all that is necessary is multiplication by the inverse of the transfer function of the transmission channel in order to compensate for the linear distortion in the transmission channel. This requires one complex or four real multiplications for each carrier frequency.

In ADSL, the physical transmission channel is a two-wire line (twin-core copper cable) in the telephone network. The two-wire line requires a long time for the transient process in comparison to the length of a block. On the other hand, any additional transmission capacity required as a result of the cyclic prefix is intended to be as low as possible.

A cyclic prefix of M=32 is defined in ADSL for a block length of N=512. However, the transient process on the two-wire line has not yet decayed after M=32 values. Additional errors thus occur in the receiver, which cannot be compensated for by a frequency-domain equalizer.

Such additional errors can be reduced by using special signal processing measures in the receiver.

To this end, a time domain equalizer (TDEQ) is connected upstream of a demodulator. The time domain equalizer is in the form of a digital transversal filter, whose coefficients are adjustable. The object of the time domain equalizer is to shorten the transient process of the transmission channel. The design of such time-domain equalizers is described in Al-Dhahir, N., Cioffi, J. M., "Optimum Finite-Length Equalization for Multicarrier Transceivers", IEEE Trans.on Comm., Vol. 44, No. 1, January 1996. However, this has the disadvantage that the digital transversal filter used as the time-domain equalizer has a large number of coefficients, and the adaptation of the digital transversal filter is complex. A filter length of 20 to 40 coefficients means that approximately 50 to 100 million multiplication operations must be carried out per second. In addition, each coefficient must be adjusted for adaptation of the digital transversal filter.

The technical problem on which the invention is based is thus to specify a digital receiver for a signal produced using discrete multitone modulation, which receiver has a time-domain equalizer which can be adapted more quickly and which carries out fewer multiplications per second.

SUMMARY

The invention relates to a digital receiver for a signal produced using discrete multitone modulation. The digital receiver has an analog/digital converter to which the signal produced using discrete multitone modulation is supplied, and has a time-domain equalizer connected downstream from the analog/digital converter. The time-domain equalizer in turn has a digital filter with fixed coefficients. The fixed coefficients of the digital filter as are required for adaptive digital filters and which require no effort for adaptation are advantageous in this case.

In one particularly preferred embodiment, the digital filter has integer values as fixed coefficients. It is particularly advantageous in this case that operations with integer values are less complex than operations with sliding-point values.

In a further particularly preferred embodiment, the digital filter has values which can be represented by shift operations as fixed coefficients. This advantageously allows multiplication operations to be replaced by shift operations, which are less complex.

In one preferred embodiment, the digital filter has a zero at 0 Hz, thus advantageously shortening the impulse response of the transmission system.

In a further preferred embodiment, the digital filter has a high-pass transfer function.

In one particularly preferred embodiment, the digital filter has a series circuit comprising a large number of first-order digital filters. The first-order filters can advantageously be produced very easily.

In a further particularly preferred embodiment, each first-order digital filter has a state memory, a shift register, a digital subtraction circuit and a digital addition circuit. The simple construction of each first-order filter is advantageous in this case, with no complex multiplication stages being required.

Further advantages, features and application options of the invention will become evident from the following description of exemplary embodiments in conjunction with the drawing, in which:

BRIEF DESCRIPTION OF THE DRAWINGS

FIG. 3 shows a diagram illustrating the effect of a time-domain equalizer according to the invention.

DETAILED DESCRIPTION

Figure 1:
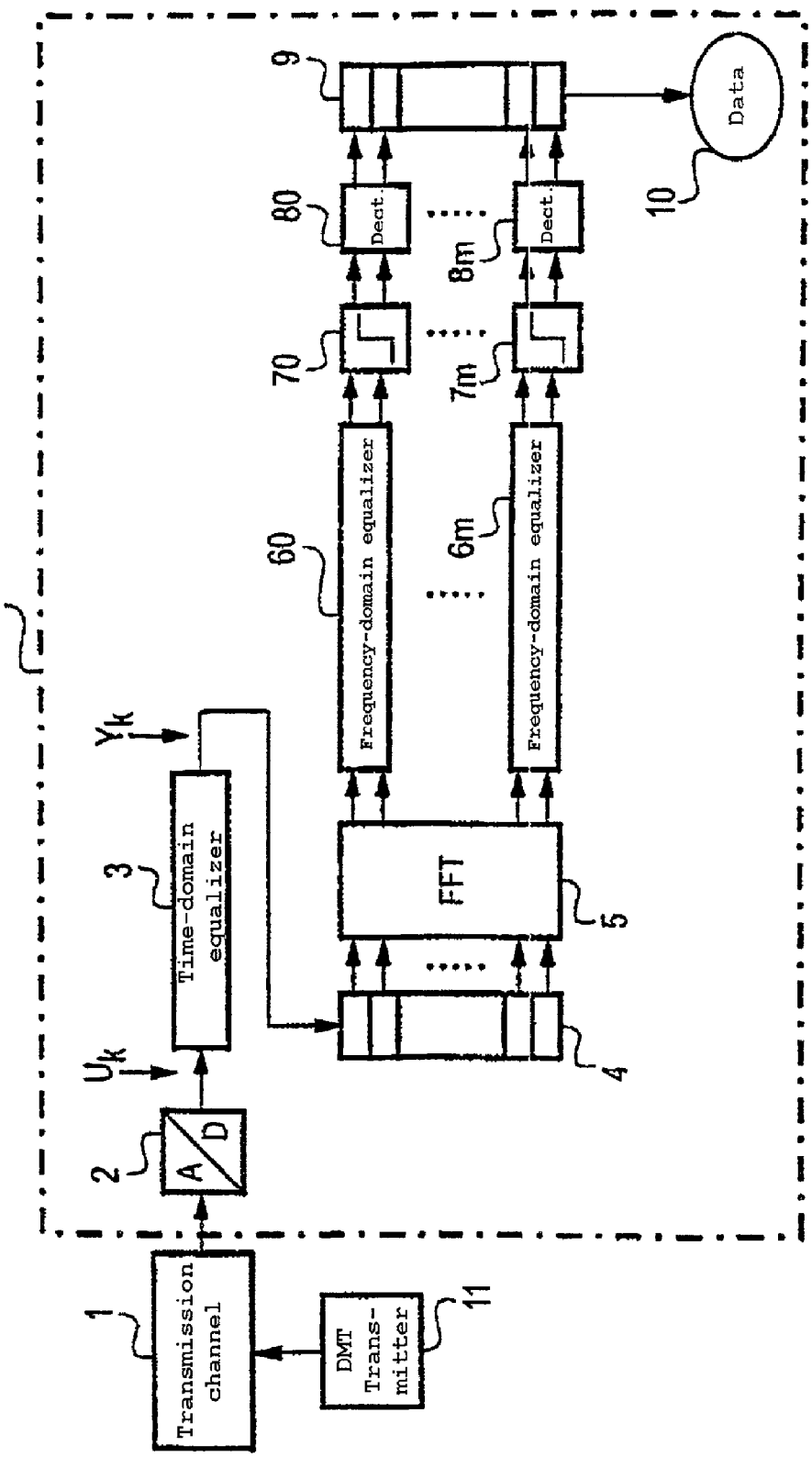
FIG. 1 shows a transmission path with a digital receiver for a signal produced using discrete multitone modulation.

In the transmission path illustrated in FIG. 1 and having a digital receiver 12, a DMT transmitter 11 produces a signal modulated using discrete multitone modulation. The signal in this case has N/2 carrier frequencies $f_1$, which are produced by discrete multitone modulation. Each carrier frequency is in this case amplitude-modulated and phase-modulated using quadrature amplitude modulation. In the DMT transmitter 11, the signal is provided with a cyclic prefix comprising M samples, and is converted by digital/analog conversion to an analog signal for transmission. The DMT transmitter 11 transmits the signal via a transmission channel 1 to the digital receiver 12.

The transmission channel 1 is a channel which produces linear distortion. In the case of ADSL transmission paths, the transmission channel is a two-wire line. Such linear distortion produced by the transmission channel 1 is compensated for once again in the digital receiver 12 by means of equalizers which operate in the frequency domain.

In the digital receiver 12, the signal is supplied to an analog/digital converter 2, which converts it to a sequence of digital values $u_k$.

The sequence of digital values $u_k$ is supplied to a time-domain equalizer 3. The time-domain equalizer 3 is used to shorten the stabilization time of the DMT transmitter 11, of the transmission channel 1 and of the time-domain equalizer 3 itself. If the stabilization time is greater than the cyclic prefix time duration, errors occur in the decision-maker circuits 70 to 7m in the digital receiver 12. The time-domain equalizer 3 is intended to shorten the stabilization time without needing to produce any zeros in the frequency band which is used for transmission. To this end, the time-domain equalizer 3 has a digital filter with fixed coefficients and having the following transfer function ($z=u_k$):

$$H(z) = \prod_{v=1}^{n} \left( \frac{1-z^{-1}}{1-c_v \cdot z^{-1}} \right) \text{ where } c_v = \pm(1-2^{-L}) \quad (1)$$

This is the transfer function of a multistage digital filter which has fixed coefficients $c_v$ and is produced by a series circuit comprising n second first-order digital filters with a transfer function $$H_v(z) = \frac{1-z^{-1}}{1-c_v \cdot z^{-1}} \text{ where } c_v = \pm(1-2^{-L}) \quad (2)$$

The transfer function H(z) of the time-domain equalizer 3 has a zero at 0 Hz, and is thus the transfer function of a high-pass filter. This is the most effective way to shorten the stabilization process of the transmission channel.

The digital values produced by the time-domain equalizer 3 are supplied to a serial/parallel converter 4 which removes the cyclic preface and produces blocks which are supplied to a discrete Fast Fourier Transformation device 5.

The discrete Fast Fourier Transformation device 5 converts the signals represented by the blocks from the time domain to the frequency domain. Each converted block at the output of the discrete Fast Fourier Transformation device 5 has N/2 complex numbers. Each complex number represents a carrier frequency $f_i=i/T$ where i=1, 2, . . . , N/2 for the discrete multitone modulation, with all the carrier frequencies $f_i$ being distributed at equal intervals. T is the time duration of a block.

The discrete Fast Fourier Transformation device 5 is followed by a frequency-domain equalizer 60, . . . , 6m for each carrier frequency $f_1, \ldots, f_{N/2}$ and this carries out the equalization process in the frequency domain. To this end, each complex number in the conversion block which represents one carrier frequency is multiplied by the inverse transfer function of the transmission channel 1. This requires one complex multiplication operation, or four real multiplication operations.

Each frequency-domain equalizer 60, . . . , 6m is followed by a respective decision-making circuit 70, . . . , 7m, which produces a multistage value from the output signal from the frequency-domain equalizer 60, . . . , 6m.

Each decision-making circuit 70, . . . , 7m is in each case followed by a decoder circuit 80, . . . , 8m, which produces a digital value from the multistage value.

The output signals from the decoder circuits 80, . . . , 8m are supplied in parallel to a parallel/serial converter 9, which is connected to a data sink 10. The parallel/serial converter 9 supplies the data sink 10 with a serial stream of digital data, corresponding to the digital data from the DMT transmitter 11.

Figure 2:
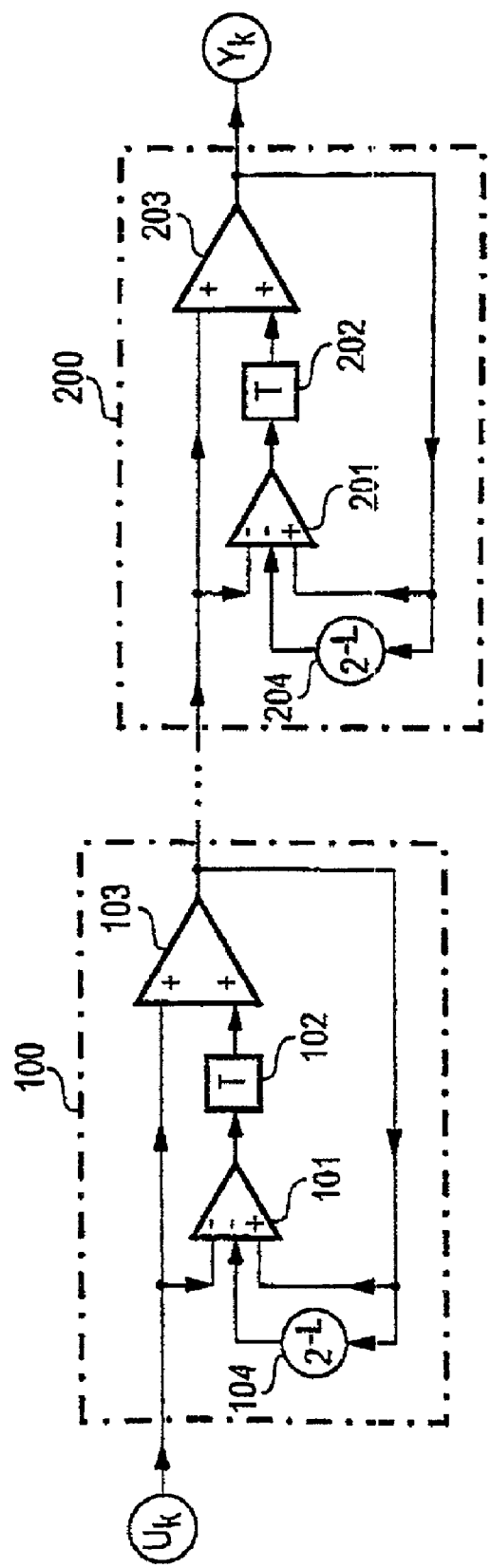
FIG. 2 shows an exemplary embodiment of a time-domain equalizer according to the invention.

FIG. 2 shows an exemplary embodiment of a time-domain equalizer according to the invention.

The time-domain equalizer has a series circuit comprising n second first-order digital filters with a transmission function as in Equation (2). FIG. 2 shows only two first-order digital filters 100 and 200. Further second first-order digital filters are indicated by dots.

All the second first-order digital filters 100 and 200 are constructed in the same way. A discrete input value sequence is supplied to a first inverting input of a digital subtraction circuit 101 or 201, respectively, and, in parallel, to a first non-inverting input of a digital addition circuit 103 or 203, respectively. One output of the digital addition circuit 103 or 203, respectively, is an output of the second first-order digital filter and is fed back in parallel form to a non-inverting input of the digital subtraction circuit and, via a shift register, to a second inverting input of the digital subtraction circuit 101 or 201, respectively. The shift register 104 or 204, respectively, multiplies a discrete output value by shifting to the right, bit-by-bit. In consequence, the discrete output value is multiplied by an integer number $2^{-L}$.

One output of the digital subtraction circuit 101 or 201, respectively, is passed via a state memory 102 or 202, respectively, to a second non-inverting input of the digital addition circuit 103 or 203, respectively. The state memory 102 or 202, respectively, produces a delay by one clock period of the clock which is used to clock the discrete input sequence.

If L=0 is chosen, the second digital filters 100 and 200 are non-recursive. In this case, in accordance with Equation (2), the coefficients $c_v$ become zero.

In one exemplary embodiment which is not illustrated, the second digital filters differ in the integer number $2^{-L}{}_v$ which is used to multiply a discrete output value from a second digital filter in the feedback path. In this exemplary embodiment, the coefficients $c_v$ in accordance with Equation (1) differ for every alternate digital filter, and that digital filter which results from the series connection of the second digital filters has a transfer function in accordance with Equation (1).

FIG. 3 uses two diagrams to illustrate the effect of six different exemplary embodiments of time-domain equalizers according to the invention. To this end, the signal-to-noise ratio and the input of the decision-making circuit was simulated on an ADSL transmission system having a two-wire line with a length of 3 km and a diameter of 0.4 mm.

Only the influences from the time-domain equalizer were considered. The signal-to-noise ratio is plotted over the entire frequency band used for ADSL transmission. A respective curve profile is indicated for each of the six different time-domain equalizers, whose respective transfer functions are $H_1(z)$ to $H_6(z)$ The transfer functions $H_1(z)$ to $H_6(z)$ are as follows:

$$H_1(z) = 1 - z^{-1}$$

$$H_2(z) = (1 - z^{-1})^2$$

$$H_3(z) = (1 - z^{-1})^3$$

$$H_4(z) = \left(\frac{1 - z^{-1}}{1 - 0.5 \cdot z^{-1}}\right)$$

$$H_5(z) = \left(\frac{1 - z^{-1}}{1 - 0.5 \cdot z^{-1}}\right)^2$$

-continued $$H_6(z) = \left(\frac{1 - z^{-1}}{1 - 0.5 \cdot z^{-1}}\right)^3$$

A curve profile without a time-domain equalizer and a curve profile having an optimized time-domain equalizer with 32 coefficients (32 taps) are shown for comparison. Both diagrams clearly show the improvement in the signal-to-noise ratio in the region of the lower frequencies. In the case of time-domain equalizers having a second, third or higher order digital filter, the signal-to-noise ratio differs from that of the optimized time-domain equalizer with 32 coefficients only by a few decibels above a frequency of about 300 kHz.

What is claimed is:

1. A digital receiver for receiving an input signal produced using discrete multitone modulation, said receiver comprising:
    an analog/digital converter to which the input signal is supplied, and
    a time-domain equalizer connected downstream from the analog/digital converter, the time-domain equalizer including a digital filter having fixed coefficients, wherein the fixed coefficients of the digital filter have values that can be represented by shift operations.

2. The digital receiver as claimed in claim 1, wherein the fixed coefficients of the digital filter have integer values.

3. The digital receiver as claimed in claim 1, wherein the digital filter has a zero at 0 Hz.

4. The digital receiver as claimed in claim 1, wherein the digital filter is a high-pass filter.

5. The digital receiver as claimed in claim 1, wherein the digital filter comprises a series of circuits, each of the circuits having a plurality of first-order digital filters.

6. The digital receiver as claimed in claim 5, wherein each first-order digital filter comprises:
    a state memory,
    a shift register,
    a subtraction circuit, and
    an addition circuit.

* * * * *